US009743523B2

(12) United States Patent
Huang et al.

(10) Patent No.: US 9,743,523 B2
(45) Date of Patent: Aug. 22, 2017

(54) PRINTED CIRCUIT BOARD PACKAGE STRUCTURE AND MANUFACTURING METHOD THEREOF

(71) Applicant: TRIPOD TECHNOLOGY CORPORATION, Ping-Jen, TaoYuan County (TW)

(72) Inventors: Bo-Shiung Huang, New Taipei (TW); Wei-Hsiung Yang, Miaoli County (TW); Han-Ching Shih, Taoyuan County (TW); Cheng-Feng Lin, Changhua County (TW)

(73) Assignee: TRIPOD TECHNOLOGY CORPORATION, Ping-Jen, Taoyuan County (TW)

( * ) Notice: Subject to any disclaimer, the term of this patent is extended or adjusted under 35 U.S.C. 154(b) by 130 days.

(21) Appl. No.: 14/512,514

(22) Filed: Oct. 13, 2014

(65) Prior Publication Data

US 2015/0107883 A1    Apr. 23, 2015

(30) Foreign Application Priority Data

Oct. 18, 2013 (TW) .............................. 102137722 A
Mar. 20, 2014 (TW) .............................. 103110521 A

(51) Int. Cl.
*H05K 1/03* (2006.01)
*H05K 1/18* (2006.01)
(Continued)

(52) U.S. Cl.
CPC ......... *H05K 1/181* (2013.01); *H01F 17/0006* (2013.01); *H01F 17/06* (2013.01);
(Continued)

(58) Field of Classification Search
CPC ....... B29C 39/10; C08G 59/621; C08L 63/00; H01F 17/06; H01F 17/0006;
(Continued)

(56) References Cited

U.S. PATENT DOCUMENTS 5,959,846 A    9/1999  Noguchi et al.
6,148,500 A    11/2000 Krone et al.
(Continued)

*Primary Examiner* — Timothy Thompson
*Assistant Examiner* — Guillermo Egoavil
(74) *Attorney, Agent, or Firm* — McClure, Qualey & Rodack, LLP

(57) ABSTRACT

A printed circuit board package structure includes a substrate, plural ring-shaped magnetic elements, a support layer, and first conductive layers. The substrate has two opposite first and second surfaces, first ring-shaped recesses, and first grooves. Each of the first ring-shaped recesses is communicated with another first ring-shaped recess through at least one of the first grooves, and at least two of the first ring-shaped recesses are communicated with a side surface of the substrate through the first grooves to form at least two openings. The ring-shaped magnetic elements are respectively located in the first ring-shaped recesses. The support layer is located on the first surface, and covers the first ring-shaped recesses and the first grooves. The support layer and the substrate have through holes. The first conductive layers are respectively located on surfaces of support layer and substrate facing the through holes.

26 Claims, 14 Drawing Sheets

(51) Int. Cl.
*H01F 27/28* (2006.01)
*H01F 41/04* (2006.01)
*H05K 3/46* (2006.01)
*H05K 1/11* (2006.01)
*H05K 3/42* (2006.01)
*H01F 17/00* (2006.01)
*H01F 17/06* (2006.01)
*H05K 1/16* (2006.01)
*H05K 3/00* (2006.01)
*H05K 1/02* (2006.01)

(52) U.S. Cl.
CPC ....... *H01F 27/2804* (2013.01); *H01F 41/046* (2013.01); *H05K 1/0366* (2013.01); *H05K 1/115* (2013.01); *H05K 3/427* (2013.01); *H05K 3/4602* (2013.01); *H05K 3/4697* (2013.01); *H05K 1/0272* (2013.01); *H05K 1/165* (2013.01); *H05K 3/0044* (2013.01); *H05K 3/0052* (2013.01); *H05K 3/4655* (2013.01); *H05K 2201/0187* (2013.01); *H05K 2201/0275* (2013.01); *H05K 2201/086* (2013.01); *H05K 2201/09036* (2013.01); *H05K 2201/1003* (2013.01); *H05K 2203/1178* (2013.01); *Y10T 29/302* (2015.01); *Y10T 29/49165* (2015.01)

(58) Field of Classification Search
CPC ............... H01F 17/062; H01F 17/0033; H01F 27/2804; H01F 41/041; H01F 41/042; H01F 41/046; H01F 41/0253; H01F 2017/048; H05K 1/115; H05K 1/165; H05K 1/181; H05K 1/0272; H05K 1/0366; H05K 3/427; H05K 3/0044; H05K 3/0052; H05K 3/4602; H05K 3/4655; H05K 3/4697; H05K 2201/086; H05K 2201/0187; H05K 2201/0275; H05K 2201/1003; H05K 2201/09036; H05K 2203/1178; Y10T 29/302; Y10T 29/4902; Y10T 29/49069; Y10T 29/49073; Y10T 29/49075; Y10T 29/49078; Y10T 29/49165
USPC .................... 29/17.3, 852; 156/293; 174/255
See application file for complete search history.

(56) References Cited

U.S. PATENT DOCUMENTS

| | | |
|---|---|---|
| 8,581,114 B2 | 11/2013 | Harrison et al. |
| 9,113,570 B2 * | 8/2015 | Li .......................... H05K 1/165 |
| 2011/0108317 A1 | 5/2011 | Harrison et al. |
| 2011/0272094 A1 * | 11/2011 | Dalmia .................. B29C 39/10 156/293 |
| 2014/0116758 A1 | 5/2014 | Li et al. |

* cited by examiner

PRINTED CIRCUIT BOARD PACKAGE STRUCTURE AND MANUFACTURING METHOD THEREOF

RELATED APPLICATIONS

This application claims priority to Taiwan Application Serial Number 102137722, filed on Oct. 18, 2013 and Taiwan application serial no. 103110521, filed on Mar. 20, 2014, which are herein incorporated by reference.

BACKGROUND

Field of Invention

The present invention relates to a printed circuit board package structure and a manufacturing method thereof.

Description of Related Art

Generally speaking, in the manufacturing process of a printed circuit board, a specific element, such as a copper block for heat dissipation, a core, etc., needs to be placed into a preset accommodation recess of the printed circuit board. The core, being magnetic, can be used in a transformer structure or a power choke structure.

In a conventional printed circuit board having a four-layered package structure, a copper clad laminate (CCL) is used as a substrate. When the printed circuit board is manufactured, a forming machine can be utilized to form a plurality of ring-shaped accommodation recesses not communicated with each other on the front surface of the substrate. Then, ring-shaped cores are placed into the accommodation recesses and epoxy is filled in the accommodation recesses to fix the cores. After that, glass fibers (FR4) having copper foils on their surfaces can be laminated to the front surface and back surface of the substrate followed by processes such as drilling, copper electroplating, and the like, to form vias that conduct the copper foils on the front surface and the back surface of the substrate. Finally, the copper foils are patterned and the front surface and the back surface of the substrate are covered by epoxy.

When the forming machine forms the accommodation recesses on the substrate, the cutting tool must first be moved downwardly to touch the substrate, then moved horizontally to cut and form the ring-shaped accommodation recess. After one accommodation recess is formed, the cutting tool is lifted to move above the location on the substrate where the next accommodation recess is expected to be formed. The aforementioned steps are repeated to form plural accommodation recesses on the substrate, such that lots of time is spent on vertical movements (ascent and descent) of the cutting tool.

In addition, the adhesive in the accommodation recesses will generate stress after being cured, which leads to reduce inductance value of the cores. In addition to that, although the adhesive may have a heat dissipation function, the gas in the accommodation recesses may still expand due to the high temperature in the infrared reflow (IR reflow) oven when surface mount technology (SMT) process is performed on the printed circuit board. As a result, pressure cannot be released to possibly damage the glass fibers and the epoxy that covers the substrate.

SUMMARY

One aspect of the present invention is to provide a printed circuit board package structure.

According to one embodiment of the present invention, a printed circuit board package structure includes a substrate, a plurality of ring-shaped magnetic elements, a support layer, and a plurality of first conductive layers. The substrate has a first surface and a second surface opposite to the first surface, a plurality of first ring-shaped recesses, and a plurality of first grooves. The first ring-shaped recesses and the first grooves are located on the first surface. Each of the first ring-shaped recesses is communicated with another one of the first ring-shaped recesses through at least one of the first grooves, and at least two of the first ring-shaped recesses are communicated with a side surface of the substrate through the first grooves to form at least two openings. The ring-shaped magnetic elements are respectively located in the first ring-shaped recesses. The support layer is located on the first surface of the substrate and covers the first ring-shaped recesses and the first grooves. The support layer and the substrate have a plurality of through holes, and the through holes are respectively adjacent to the first ring-shaped recesses. The first conductive layers are respectively located on surfaces of the support layer and the substrate facing the through holes. Each of the first conductive layers has a first end and a second end opposite to the first end, and the first end extends to a surface of the support layer opposite to the substrate, the second end extends to the second surface of the substrate.

Another aspect of the present invention is to provide a printed circuit board package structure.

According to one embodiment of the present invention, a printed circuit board package structure includes a substrate, a ring-shaped magnetic element, a support layer, and a plurality of first conductive layers. The substrate has a first surface and a second surface opposite to the first surface, a ring-shaped recess, and a plurality of grooves. The ring-shaped recess and the grooves are located on the first surface. The ring-shaped recess is communicated with a side surface of the substrate through the grooves to form at least two openings. The ring-shaped magnetic element is located in the ring-shaped recess. The support layer is located on the first surface of the substrate and covers the ring-shaped recess and the grooves. The support layer and the substrate have a plurality of through holes, and the through holes are adjacent to the ring-shaped recess. The first conductive layers are respectively located on surfaces of the support layer and the substrate facing the through holes. Each of the first conductive layers has a first end and a second end opposite to the first end, and the first end extends to a surface of the support layer opposite to the substrate, the second end extends to the second surface of the substrate.

In the aforementioned embodiments, since the substrate has the first grooves and the first ring-shaped recesses for accommodating the ring-shaped magnetic elements and the first grooves are communicated with the adjacent first ring-shaped recesses, an opening can be formed by the first groove on a side surface of the substrate after being cut when the printed circuit board package structure is cut along a direction perpendicular to the first grooves. Therefore, when the cut printed circuit board package structure is bonded by the surface mount technology process, the gas in the first ring-shaped recesses can flow out through the first grooves to release pressure although the gas will expand due to the high temperature in the infrared reflow oven. The prior art adhesive can be omitted to increase the inductance value of the ring-shaped magnetic elements. In addition, the first grooves are not exposed before the printed circuit board package structure is cut because they are covered by the support layer to avoid that the liquid used in processes before cutting the printed circuit board package structure enters into the first ring-shaped recesses through the first grooves to cause pollution.

Still another aspect of the present invention is to provide a manufacturing method of a printed circuit board package structure.

According to one embodiment of the present invention, a manufacturing method of a printed circuit board package structure includes the following steps: (a) providing a substrate; (b) forming a plurality of first ring-shaped recesses and a plurality of first grooves on a first surface of the substrate, each of the first ring-shaped recesses being communicated to another one of the first ring-shaped recesses through at least one of the first grooves; (c) placing a plurality of ring-shaped magnetic elements in the first ring-shaped recesses; (d) attaching a support layer to the first surface of the substrate to allow the support layer to cover the first ring-shaped recesses and the first grooves; (e) forming a plurality of through holes that penetrate through the support layer and the substrate, and the through holes being respectively adjacent to the first ring-shaped recesses; (f) forming a plurality of first conductive layers on surfaces of the support layer and the substrate facing the through holes, a surface of the support layer opposite to the substrate, and a second surface of the substrate; and (g) patterning the first conductive layers on the surface of the support layer opposite to the substrate and the second surface of the substrate.

In the aforementioned embodiment, the cutting tool can be lowered into the substrate when forming the first ring-shaped recesses and the first grooves, and thereafter the cutting tool is allowed to cut and form the first ring-shaped recesses and the first grooves by moving horizontally. The cutting tool would not be lifted until the first ring-shaped recesses and the first grooves communicated with the first ring-shaped recesses are formed. Therefore, the time spent on vertical movements (ascent and descent) of the cutting tool can be reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and components are schematically depicted in order to simplify the drawings.

Figure 1:
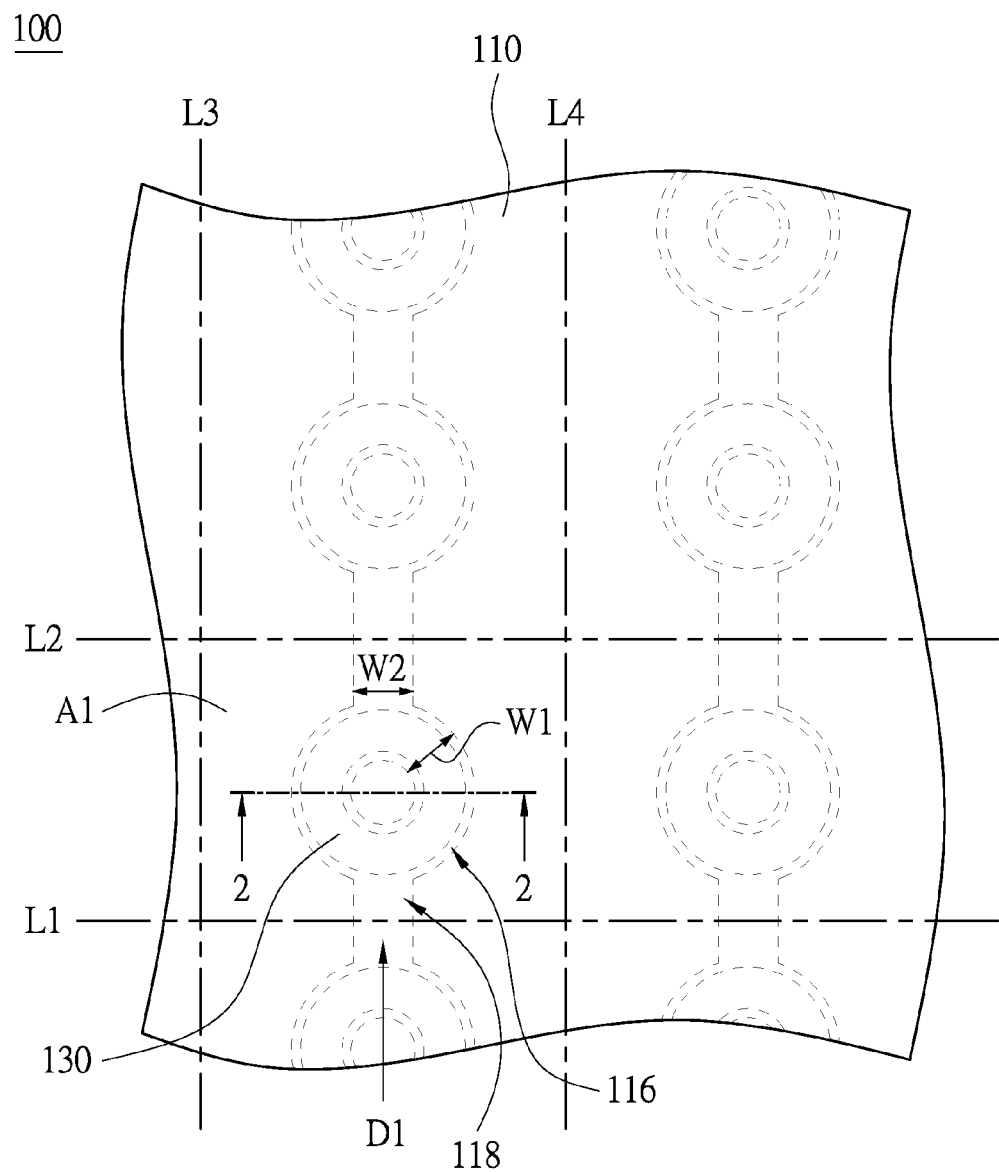
FIG. 1 is a top view of a printed circuit board package structure according to one embodiment of this invention.
Figure 2:
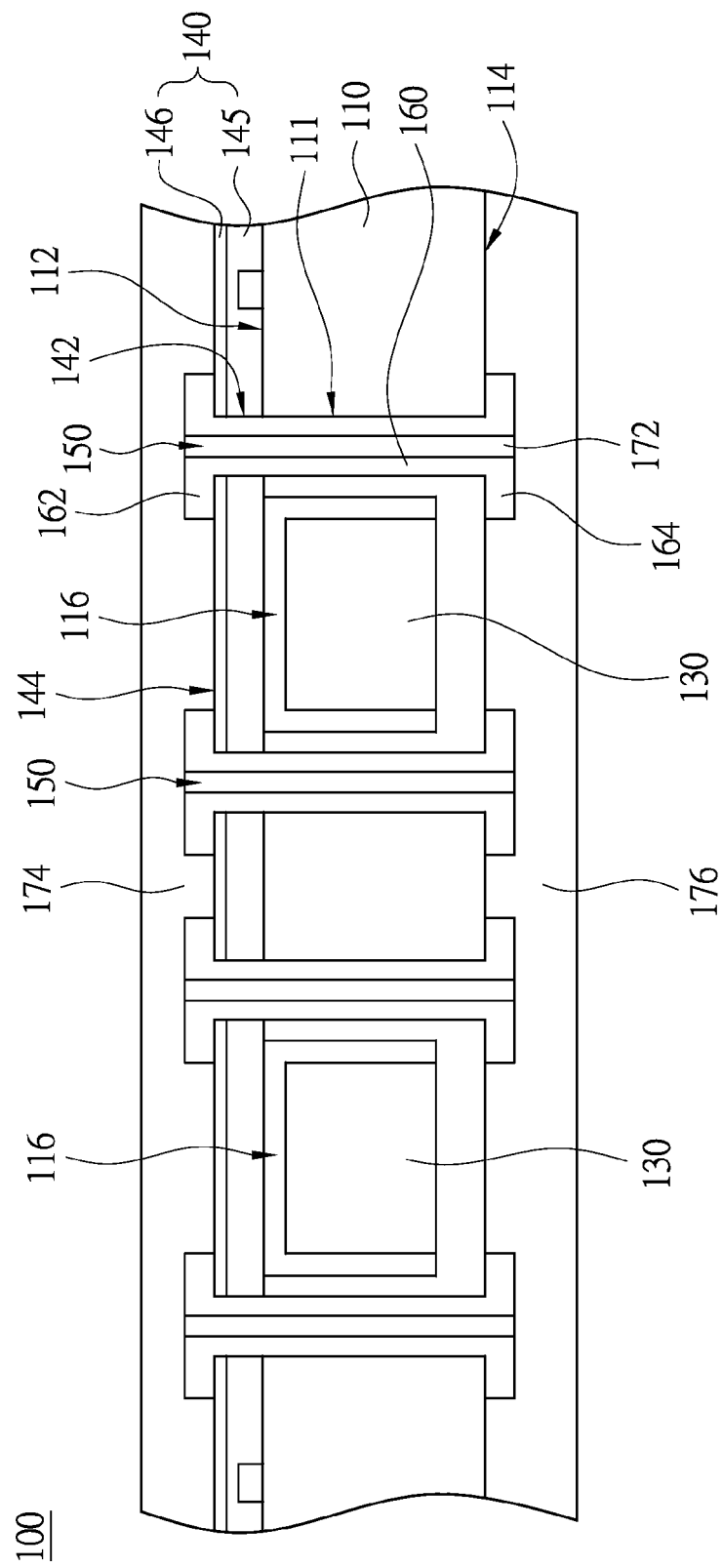
FIG. 2 is a cross-sectional view of the printed circuit board package structure taken along line 2-2 shown in FIG. 1.

FIG. 1 is a top view of a printed circuit board package structure 100 according to one embodiment of this invention. FIG. 2 is a cross-sectional view of the printed circuit board package structure 100 taken along line 2-2 shown in FIG. 1. As shown in FIG. 1 and FIG. 2, the printed circuit board package structure 100 includes a substrate 110, a plurality of ring-shaped magnetic elements 130, a support layer 140, and a plurality of first conductive layers 160. The substrate 110 has a first surface 112 and a second surface 114 opposite to the first surface 112, a plurality of first ring-shaped recesses 116, and a plurality of first grooves 118. The first ring-shaped recesses 116 and the first grooves 118 are located on the first surface 112 of the substrate 110. Each of the first ring-shaped recesses 116 is communicated with another one of the first ring-shaped recesses 116 through at least one of the first grooves 118, and lengthwise directions D1 of all the first grooves 118 are the same.

The ring-shaped magnetic elements 130 are respectively located in the first ring-shaped recesses 116. The support layer 140 is located on the first surface 112 of the substrate 110 and covers the first ring-shaped recesses 116 and the first grooves 118. The support layer 140 and the substrate 110 have a plurality of through holes 150. The through hole 150 is adjacent to two opposite walls of the first ring-shaped recess 116. In addition, the first conductive layers 160 are respectively located on surfaces 142 of the support layer 140 facing the through holes 150 and surfaces 111 of the substrate 110 facing the through holes 150. Each of the first conductive layers 160 has a first end 162 and a second end 164 opposite to the first end 162. The first end 162 extends to a surface of 144 of the support layer 140 opposite to the substrate 110. The second end 164 extends to the second surface 114 of the substrate 110.

The support layer 140 may include a glass fiber layer containing non-cured epoxy (PP, b-stage) 145 and a glass fiber layer containing cured epoxy (FR4, c-stage) 146. The glass fiber layer containing non-cured epoxy 145 is located at the lower level of the support layer 140 and covers the first ring-shaped recesses 116 and the first grooves 118. The glass fiber layer containing cured epoxy 146 is located at the upper level of the support layer 140 and covers the lower-leveled glass fiber layer containing non-cured epoxy 145.

In this embodiment, the printed circuit board package structure 100 further includes a plurality of first protective layers 172, a second protective layer 174, and a third protective layer 176. The first protective layers 172 are respectively located in the through holes 150. The second protective layer 174 covers the surface 144 of the support layer 140 opposite to the substrate 110 and the first ends 162 of the first conductive layers 160. The third protective layer 176 covers the second surface 114 of the substrate 110 and the second ends 164 of the first conductive layers 160. After a cutting tool cuts the printed circuit board package structure 100 along lines L1, L2, L3, L4, the printed circuit board package structure 100 within area A1 may be regarded as a power choke.

Figure 3:
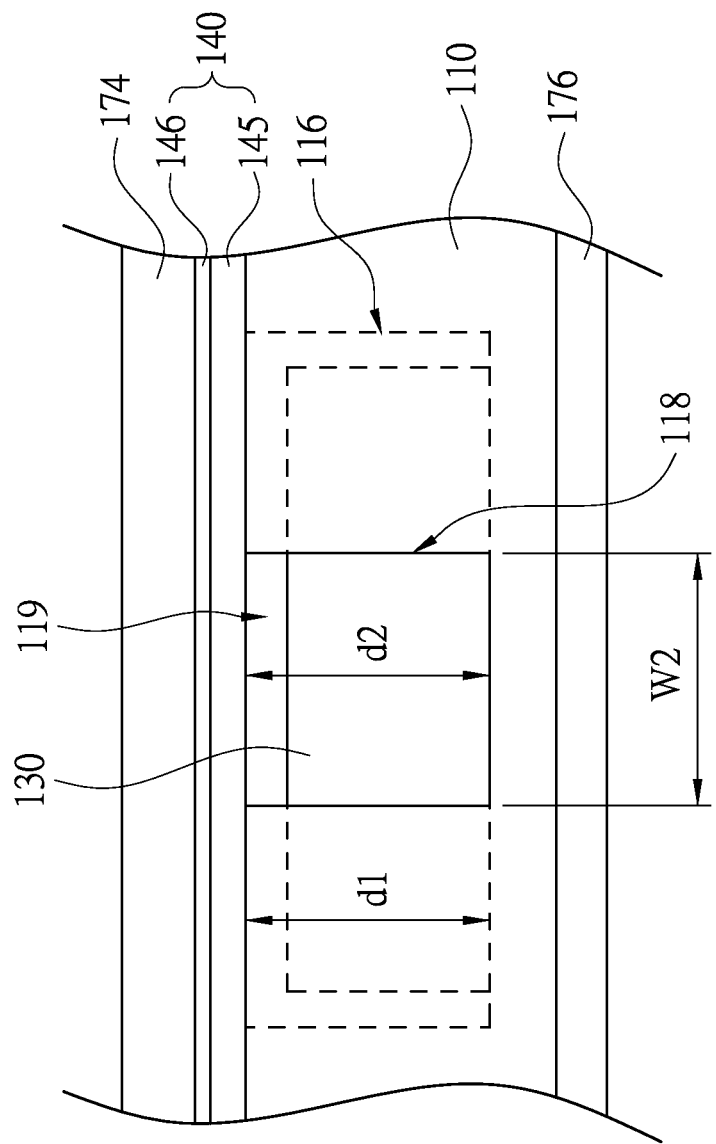
FIG. 3 is a side view of the printed circuit board package structure viewed from a direction D1 after being cut along line L1 shown in FIG. 1.

FIG. 3 is a side view of the printed circuit board package structure 100 viewed from a direction D1 after being cut along line L1 shown in FIG. 1. As shown in FIG. 1 and FIG. 3, since the substrate 110 has the first grooves 118 and the first ring-shaped recesses 116 for accommodating the ring-shaped magnetic elements 130 and two ends of the first groove 118 are communicated with the two adjacent first ring-shaped recesses 116, an opening 119 can be formed by the first groove 118 on a side surface of the substrate 110 after being cut when the printed circuit board package structure 100 is cut along a direction perpendicular to the first grooves 118 (e.g., along lines L1, L2). For example, a junction between line L1 and the first groove 118 can form the opening 119, and a junction between line L2 and the first groove 118 can also form the opening 119. Therefore, when the cut printed circuit board package structure 100 is bonded by the surface mount technology (SMT) process, the gas in the first ring-shaped recesses 116 can flow out from the openings 119 through the first grooves 118 to release pressure although the gas will expand due to the high temperature in the infrared reflow (IR reflow) oven. The prior art adhesive can be omitted to increase the inductance value of the ring-shaped magnetic elements 130. In addition, the first grooves 118 are not exposed before the printed circuit board package structure 100 is cut because they are covered by the support layer 140, and so as to avoid that the liquid used in processes before cutting the printed circuit board package structure 100 enters into the first ring-shaped recesses 116 through the first grooves 118.

In this embodiment, diameters of the first ring-shaped recesses 116 are all the same. A distance W1 between two opposite inner walls of each of the first ring-shaped recesses 116 is the same as a distance W2 between two opposite inner walls of each of the first grooves 118, and a depth d1 of each of first ring-shaped recesses 116 is the same as a depth d2 of each of the first grooves 118. With such a design, when a forming machine is utilized to form the first ring-shaped recesses 116 and the first grooves 118 in the substrate 110, the cutting tool of the forming machine can be horizontally moved at a fixed-vertical height to form the first ring-shaped recesses 116 and the first grooves 118 communicated with the first ring-shaped recesses 116 (e.g., the first ring-shaped recesses 116 and the first grooves 118 between lines L3, L4). Therefore, the time spent on forming the first ring-shaped recesses 116 and the first grooves 118 can be reduced.

It is to be noted that the connection relationships between those components described above are not be repeated. In the following description, a manufacturing method of the printed circuit board package structure 100 will be described.

Figure 4:
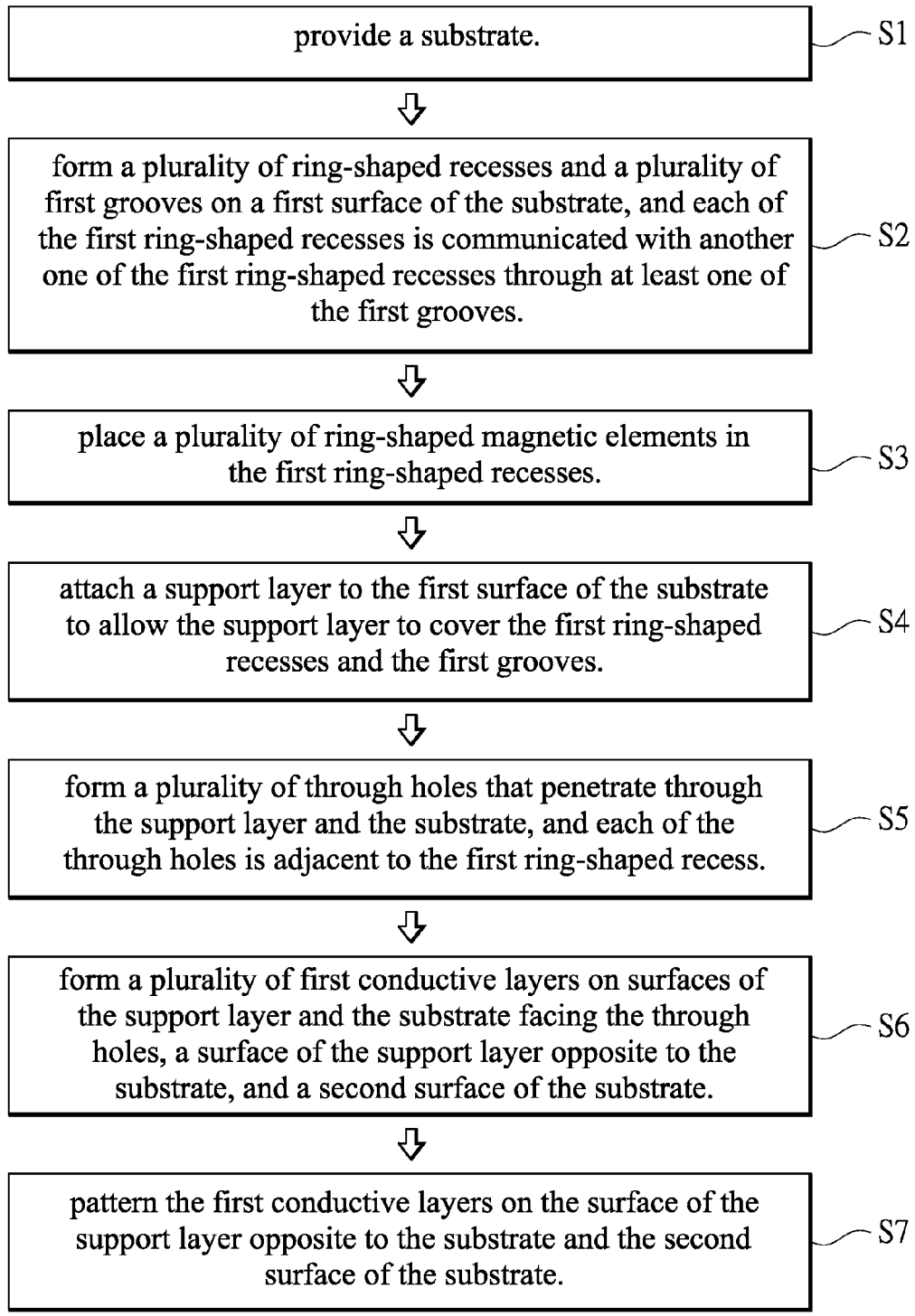
FIG. 4 is a flow chart of a manufacturing method of a printed circuit board package structure according to one embodiment of this invention.

FIG. 4 is a flow chart of a manufacturing method of a printed circuit board package structure according to one embodiment of this invention. First, in step S1, provide a substrate. Then, in step S2, form a plurality of ring-shaped recesses and a plurality of first grooves on a first surface of the substrate, and each of the first ring-shaped recesses is communicated with another one of the first ring-shaped recesses through at least one of the first grooves. After that, in step S3, place a plurality of ring-shaped magnetic elements in the first ring-shaped recesses. Then, in step S4, attach a support layer to the first surface of the substrate to allow the support layer to cover the first ring-shaped recesses and the first grooves. After that, in step S5, form a plurality of through holes that penetrate through the support layer and the substrate, and each of the through holes is adjacent to the first ring-shaped recess. Then, in step S6, form a plurality of first conductive layers on surfaces of the support layer and the substrate facing the through holes, a surface of the support layer opposite to the substrate, and a second surface of the substrate. Finally, in step S7, pattern the first conductive layers on the surface of the support layer opposite to the substrate and the second surface of the substrate.

In the following description, each step of the above-mentioned manufacturing method of a printed circuit board package structure will be described.

Figure 5:
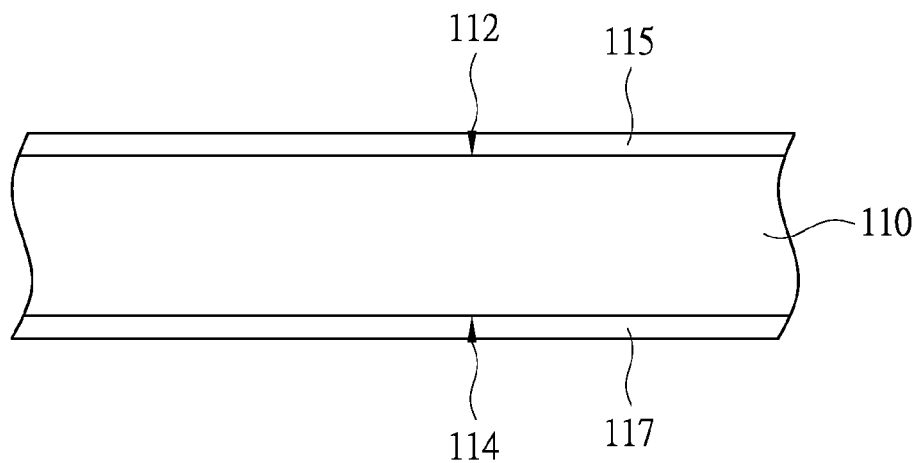
FIG. 5 is a cross-sectional view of the substrate shown in FIG. 4.

FIG. 5 is a cross-sectional view of the substrate 110 shown in FIG. 4. The first surface 112 and the second surface 114 of the substrate 110 respectively have copper foils 115, 117, and the substrate 110 may be a copper clad laminate (CCL) containing a glass fiber (FR4). The copper foil 115 of the substrate 110 may be patterned to form an alignment portion 115a (see FIG. 6) used by the subsequent process equipment for positioning. The term "patterned" in the specification may include steps such as exposure, development, etching, etc., but the present invention is not limited in this regard.

Figure 6:
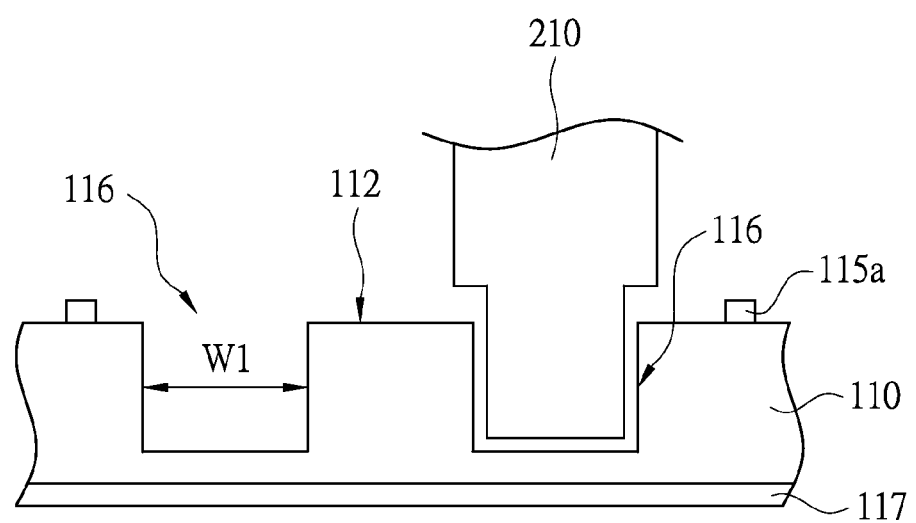
FIG. 6 is a cross-sectional view of the substrate shown in FIG. 5 when first ring-shaped recesses are formed.
Figure 7:
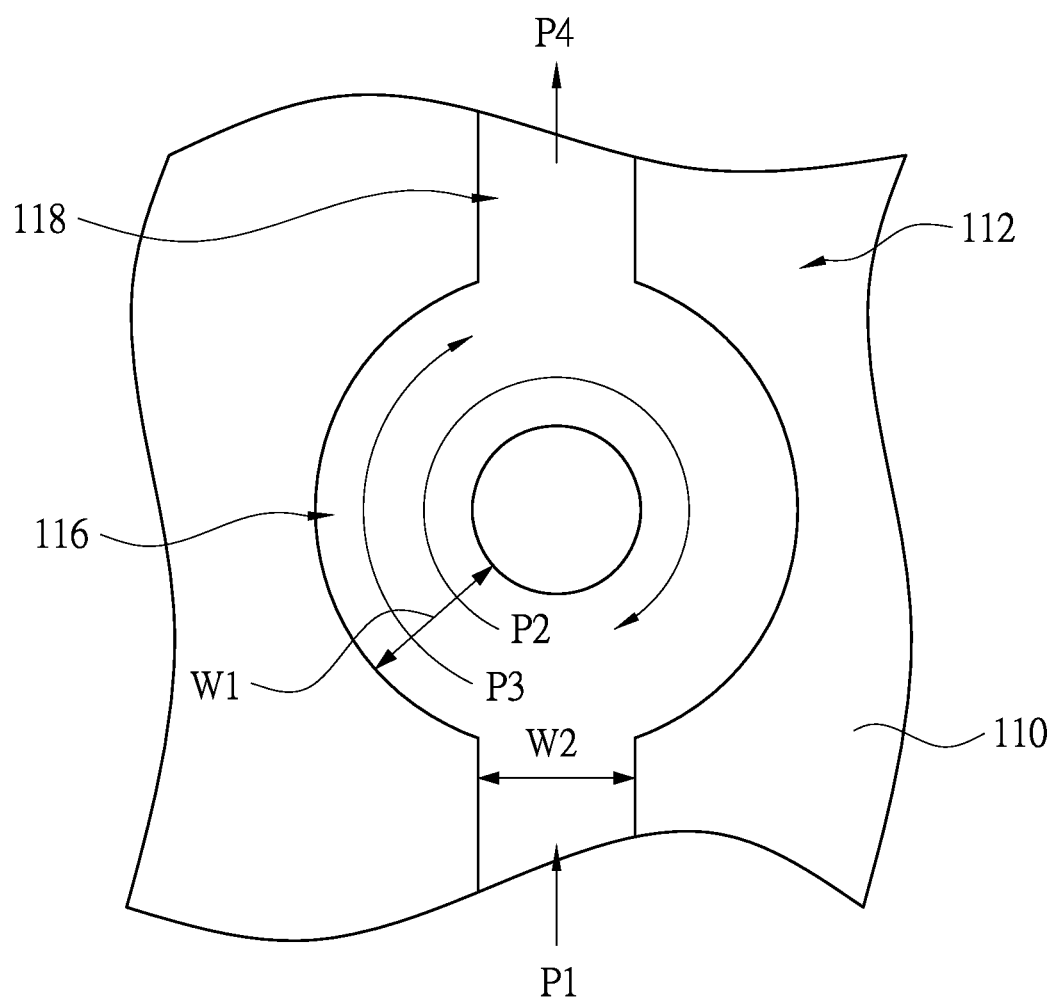
FIG. 7 is a top view of a motion path of a cutting tool shown in FIG. 6.

FIG. 6 is a cross-sectional view of the substrate 110 shown in FIG. 5 when the first ring-shaped recesses 116 are formed. FIG. 7 is a top view of a motion path of a cutting tool 210 shown in FIG. 6. As shown in FIG. 6 and FIG. 7, the cutting tool 210 of the forming machine then may be utilized to form the first ring-shaped recesses 116 and the first grooves 118 on the first surface 112 of the substrate 110. Since the cutting tool 210 can be lowered onto the first surface 112 of the substrate 110 when forming the first ring-shaped recesses 116 and the first grooves 118, the cutting tool 210 can cut and form the first ring-shaped recesses 116 having the distance W1 and the depth d1 and the first grooves 118 having the distance W2 and the depth d2 (see FIG. 3) that are respectively the same as the distance W1 and the depth d1 by horizontally moving along paths P1, P2, P3, P4 in sequence at a fixed vertical height.

After the first ring-shaped recesses 116 and the first grooves 118 communicated with the first ring-shaped recesses 116 are formed (e.g., all of the first ring-shaped recesses 116 and the first grooves 118 between lines L3, L4 in FIG. 1), the cutting tool 210 is then lifted to leave the substrate 110. Hence, not only the time spent on vertical movements (ascent and descent) of the cutting tool 210 in the substrate 110 can be saved, but the two ends of each of the first grooves 118 are also communicated with the two adjacent first ring-shaped recesses 116 (as shown in FIG. 1). In addition, the first ring-shaped recesses 116 and the first grooves 118 may also be formed by infrared laser cutting, which is suitable for the printed circuit board package structure 100 having many lines (see FIG. 1).

Figure 8:
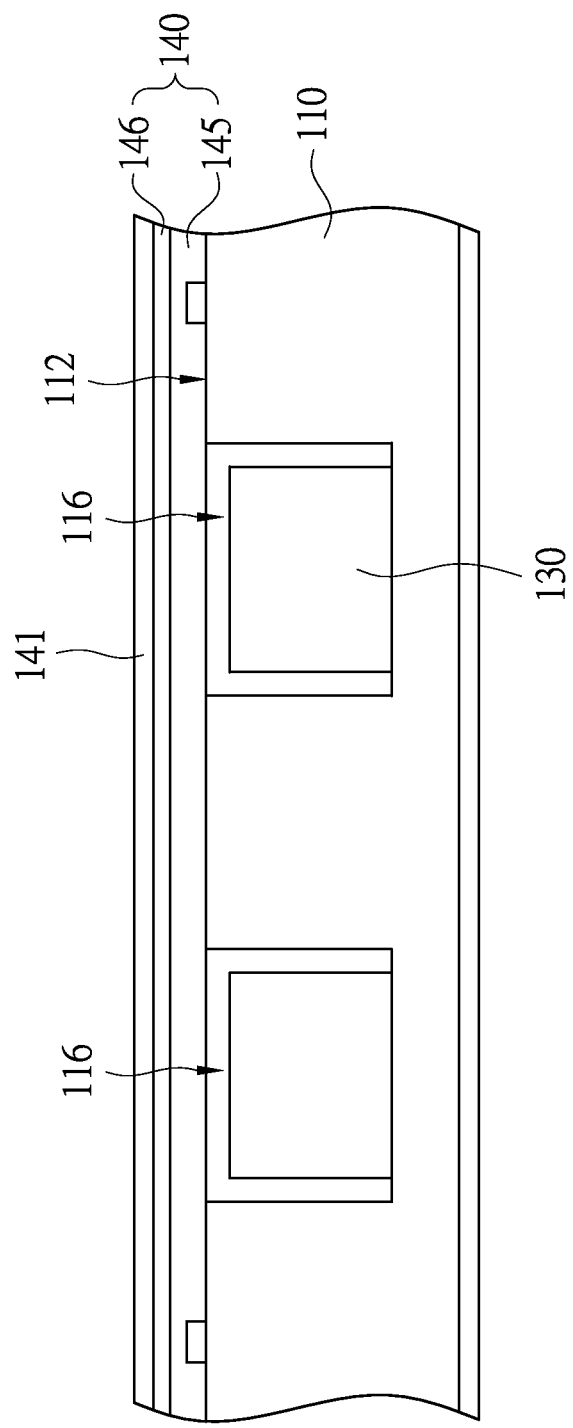
FIG. 8 is a cross-sectional view of ring-shaped magnetic elements being placed into the first ring-shaped recesses and a support layer being attached to a substrate shown in FIG. 7.

FIG. 8 is a cross-sectional view of the ring-shaped magnetic elements 130 being placed into the first ring-shaped recesses 116 and the support layer 140 being attached to the substrate 110 shown in FIG. 7. As shown in FIG. 7 and FIG. 8, after the first ring-shaped recess 116 and the first grooves 118 (see FIG. 7) are formed in the substrate 110, the ring-shaped magnetic elements 130 may be placed into the first ring-shaped recesses 116. After that, the support layer 140 may be attached to the first surface 112 of the substrate 110 so that the first ring-shaped recesses 116 and the first grooves 118 are covered by the support layer 140. In this embodiment, a surface of the support layer 140 has a copper foil 141.

Figure 9:
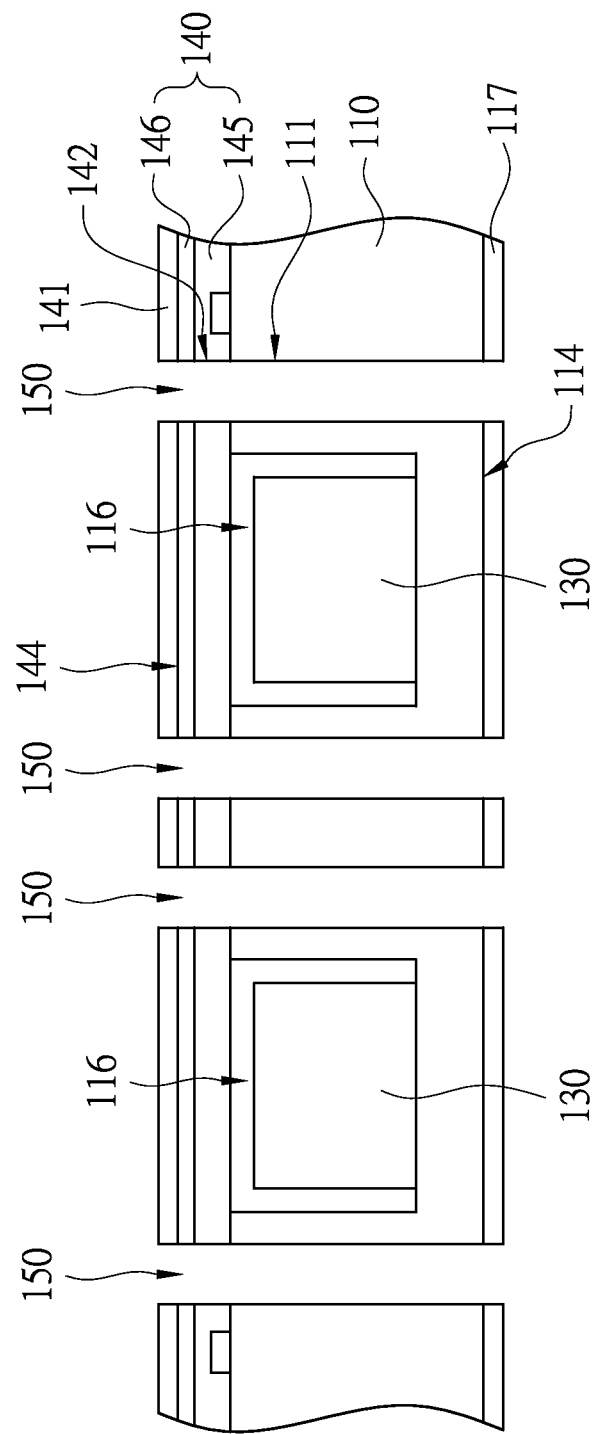
FIG. 9 is a cross-sectional view of through holes being formed in the support layer and the substrate shown in FIG. 8.

FIG. 9 is a cross-sectional view of the through holes 150 being formed in the support layer 140 and the substrate 110 shown in FIG. 8. As shown in FIG. 8 and FIG. 9, after the support layer 140 is attached to the substrate 110, the through holes 150 my be formed to penetrate through the support layer 140 and the substrate 110, and each of the through holes 150 is adjacent to the two opposite walls of the first ring-shaped recess 116.

Figure 10:
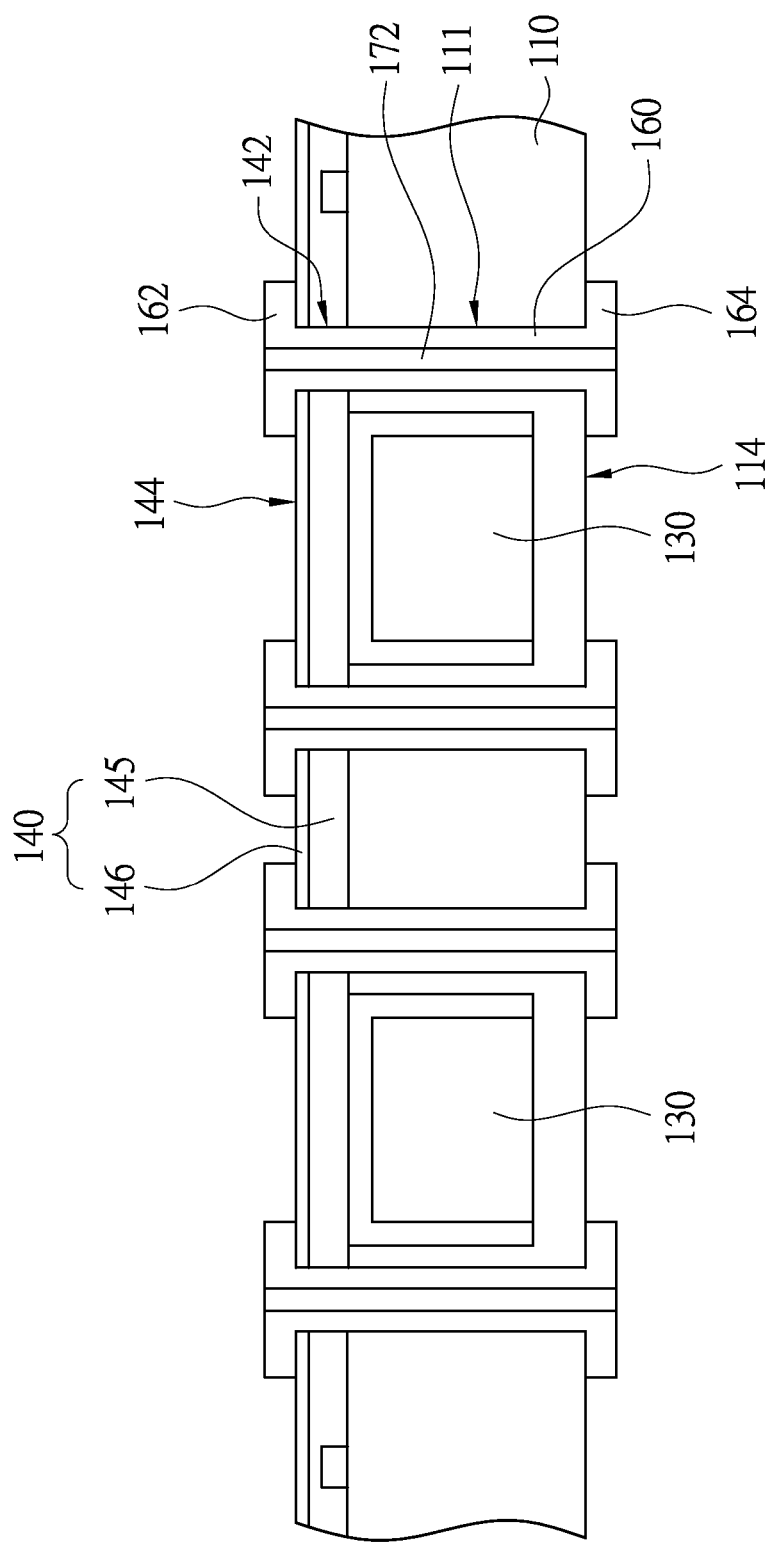
FIG. 10 is a cross-sectional view of first conductive layers being formed on the support layer and the substrate shown in FIG. 9.

FIG. 10 is a cross-sectional view of the first conductive layer 160 being formed on the support layer 140 and the substrate 110 shown in FIG. 9. As shown in FIG. 9 and FIG. 10, after the through holes 150 are formed in the support layer 140 and the substrate 110, the first conductive layers 160 may be formed on the copper foil 141, the surfaces 142 of the support layer 140 facing the through holes 150, the surfaces 111 of the substrate 110 facing the through holes 150, and the copper foil 117 by electroplating. The first conductive layer 160 may be made of a material including copper that can combine with the cooper foils 117, 141 to allow the first conductive layers 160 to be located on the surfaces 144 of the support layer 140 opposite to the substrate 110 and the second surface 114 of the substrate 110.

Then, the first protective layer 172 may be formed in each of the through holes 150 so that each of the through holes 150 is filled up with the first protective layer 172. After that, the first conductive layers 160 on the surface 144 of the support layer 140 and the second surface 114 of the substrate 110 are patterned to allow the first conductive layer 160 to have the first end 162 and the second end 164, and so as to obtain the structure shown in FIG. 10.

As shown in FIG. 2 and FIG. 10, after the first conductive layers 160 are patterned, the second protective layer 174 may be formed to cover the surface 144 of the support layer 140 and the first ends 162 of the first conductive layers 160 on the surfaces 144 of the support layer 140, and the third protective layer 176 may be formed to cover the second surface 114 of the substrate 110 and the second ends 164 of the first conductive layers 160 on the second surface 114 of the substrate 110. In this embodiment, the first protective layers 172, the second protective layer 174, and the third protective layer 176 may be made of a material including epoxy, such as a solder mask commonly used, but the present invention is not limited in this regard. Moreover, the third protective layer 176 may be replaced with a reinforcing support layer. The reinforcing support layer may be a copper foil layer, a release film, epoxy, or a glass fiber layer containing cured epoxy, but the present invention is not limited in this regard.

As shown in FIG. 1 and FIG. 2, after the second protective layer 174 and the third protective layer 176 are formed, the second protective layer 174, the support layer 140, the substrate 110, and the third protective layer 176 may be cut along the direction perpendicular to the first grooves 118 (e.g., along lines L1, L2) so that each of the first grooves 118 forms the opening 119 (see FIG. 3) on the side surface of the substrate 110 after being cut.

Figure 11:
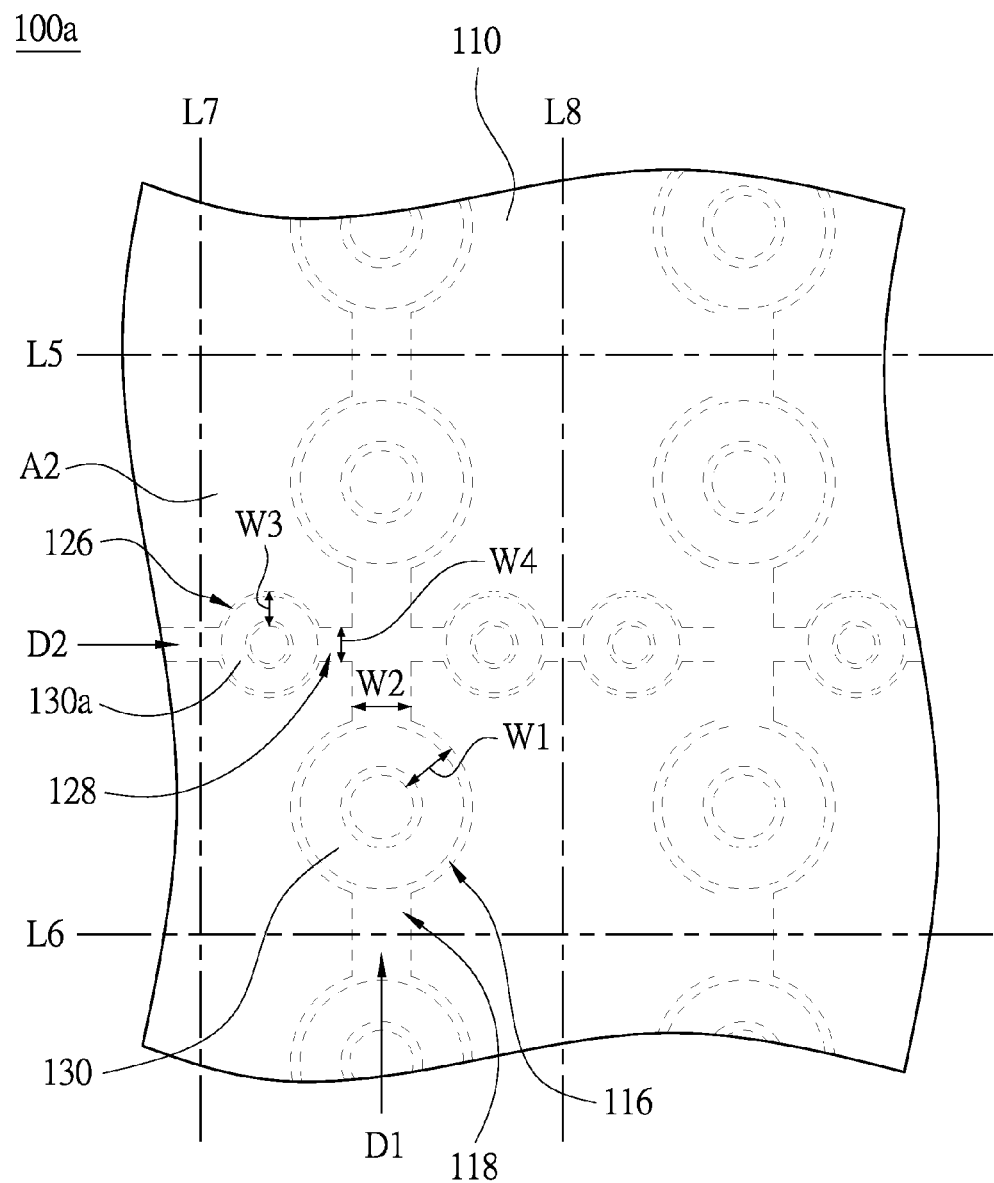
FIG. 11 is a top view of a printed circuit board package structure according to another embodiment of this invention.
Figure 12:
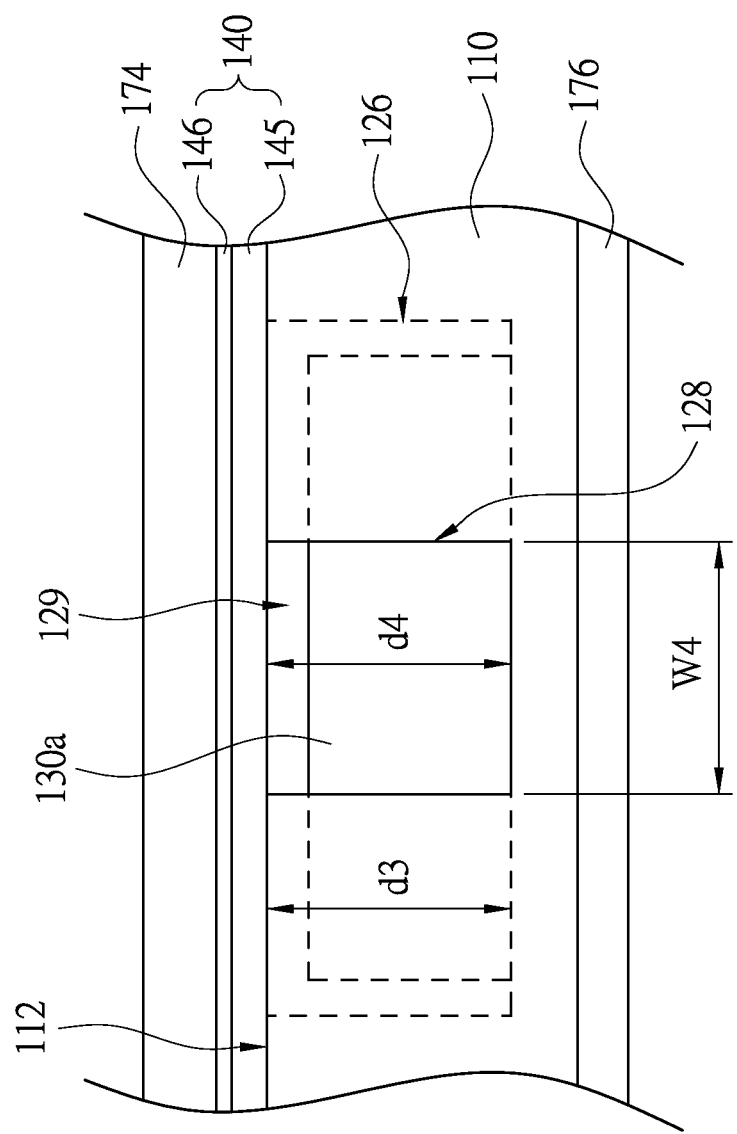
FIG. 12 is a side view of the printed circuit board package structure viewed from a direction D2 after being cut along line L7 shown in FIG. 11.

FIG. 11 is a top view of a printed circuit board package structure 100a according to another embodiment of this invention. FIG. 12 is a side view of the printed circuit board package structure 100a viewed from a direction D2 after being cut along line L7 shown in FIG. 11. As shown in FIG. 11 and FIG. 12, the difference between this embodiment and the embodiment shown in FIGS. 1 and 3 is that the substrate 110 further has a plurality of second ring-shaped recesses 126 and a plurality of second grooves 128. The second ring-shaped recesses 126 and the second grooves 128 are located on the first surface 112 of the substrate 110. Two ends of each of the second grooves 128 are communicated with the two adjacent second ring-shaped recesses 126, and each of the second grooves 128 crosses and is communicated with one of the first grooves 118. In this embodiment, a lengthwise direction D2 of the second groove 128 is perpendicular to the lengthwise direction D1 of the first groove 118. A distance W3 between two opposite inner walls of each of the second ring-shaped recesses 126 is smaller than the distance W1 between the two opposite inner walls of each of the first ring-shaped recesses 116, and ring-shaped magnetic elements 130a in the second ring-shaped recesses 126 are smaller than the ring-shaped magnetic elements 130.

After a cutting tool cuts the printed circuit board package structure 100a along lines L5, L6, L7, L8, the printed circuit board package structure 100a within area A2 may be regarded as a transformer used in a connector.

When the printed circuit board package structure 100a is cut along a direction perpendicular to the second grooves 128 (e.g., along lines L7, L8), an opening 129 can be formed by the second groove 128 on a side surface of the substrate 110 after being cut. Therefore, when the cut printed circuit board package structure 100a is bonded by the surface mount technology (SMT) process, the gas in the second ring-shaped recesses 126 can flow out from the openings 129 through the second grooves 128 to release pressure although the gas will expand due to the high temperature in the infrared reflow (IR reflow) oven. The prior art adhesive can be omitted to increase the inductance value of the ring-shaped magnetic elements 130a. In addition, the second grooves 128 are not exposed before the printed circuit board package structure 100a is cut because they are covered by the support layer 140 to avoid that the liquid used in processes before cutting the printed circuit board package structure 100a enters into the second ring-shaped recesses 126 through the second grooves 128.

In this embodiment, the distance W3 between the two opposite inner walls of each of the second ring-shaped recesses 126 is the same as a distance W4 between two opposite inner walls of each of the second grooves 128, and a depth d3 of each of second ring-shaped recesses 126 is the same as a depth d4 of each of the second grooves 128. With such a design, when a forming machine is utilized to form the second ring-shaped recesses 126 and the second grooves 128 in the substrate 110, the cutting tool of the forming machine can be horizontally moved at a fixed-vertical height to form the second ring-shaped recesses 126 and the second grooves 128 communicated with the second ring-shaped recesses 126 (e.g., the second ring-shaped recesses 126 and the second grooves 128 between lines L5, L6). Therefore, the time spent on forming the second ring-shaped recesses 126 and the second grooves 128 can be reduced.

When the cutting tool forms the first ring-shaped recesses 116 and the first grooves 118 on the first surface 112 of the substrate 110, the second ring-shaped recesses 126 and the second grooves 128 can also be formed on the first surface 112 of the substrate 110 by the cutting tool. Since the manufacturing method of the printed circuit board package structure 100*a* is the same as the manufacturing method of the printed circuit board package structure 100 (see FIG. 1) except that steps of forming the second ring-shaped recesses 126 and the second grooves 128 are added, the following description will not described again.

Figure 13:
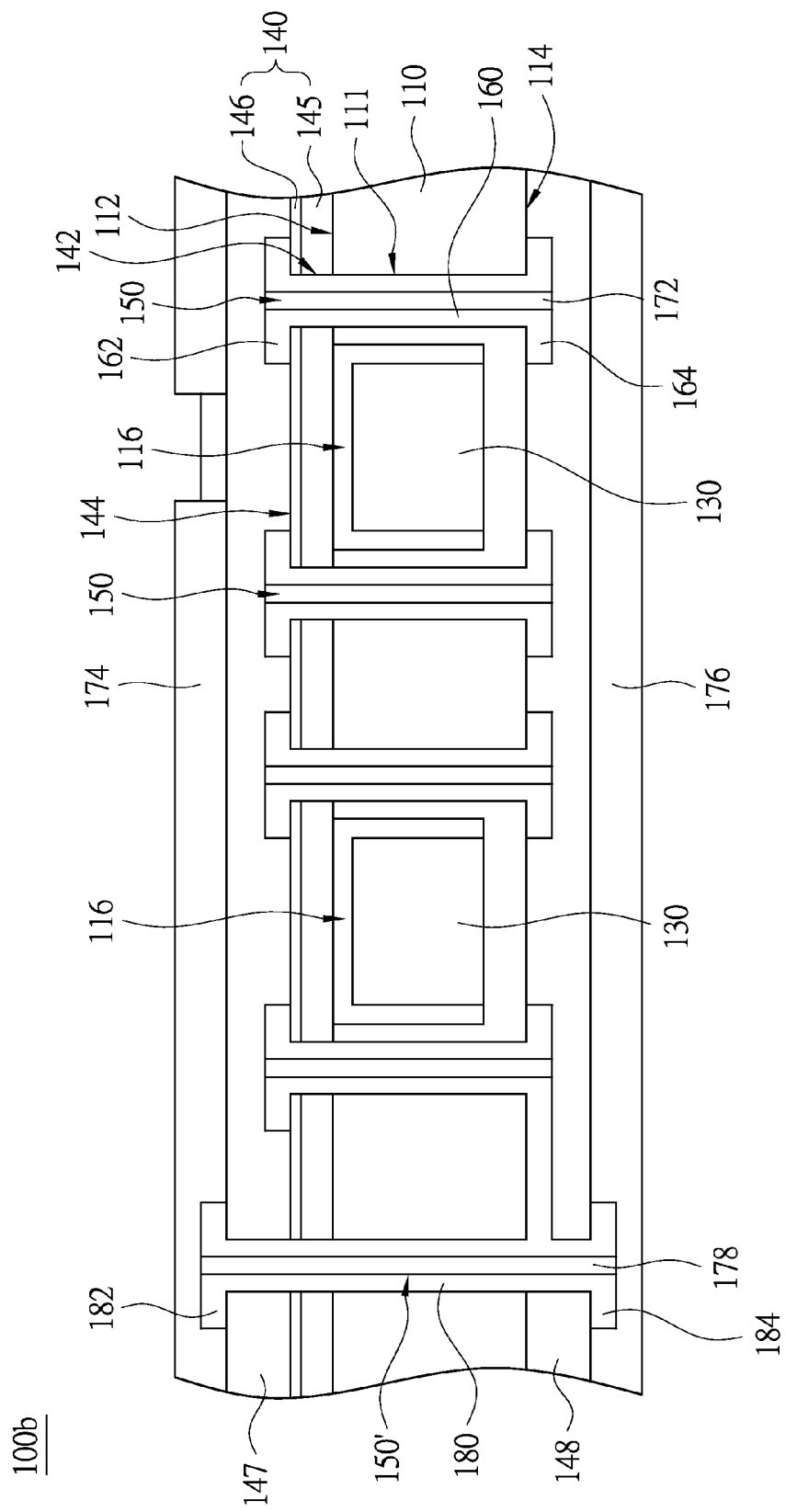
FIG. 13 is a cross-sectional view of a printed circuit board package structure according to another embodiment of this invention with a profile position same as that in FIG. 2.

FIG. 13 is a cross-sectional view of a printed circuit board package structure 100*b* according to another embodiment of this invention with a profile position same as that in FIG. 2. The printed circuit board package structure 100*b* may also have the first ring-shaped recesses 116 and the first grooves 118 shown in FIG. 1, and may selectively have the second ring-shaped recesses 126 and the second grooves 128 shown in FIG. 11. In this embodiment, besides the substrate 110, the ring-shaped magnetic elements 130, the support layer 140, and the first conductive layers 160, the printed circuit board package structure 100*b* further includes a first glass fiber layer containing non-cured epoxy 147, a second glass fiber layer containing non-cured epoxy 148, a plurality of second conductive layers 180, the second protective layer 174, the third protective layer 176, and a plurality of fourth protective layers 178.

The first glass fiber layer containing non-cured epoxy 147 covers the surface 144 of the support layer 140 opposite to the substrate 110 and the first ends 162 of the first conductive layers 160. The second glass fiber layer containing non-cured epoxy 148 covers the second surface 114 of the substrate 110 and the second ends 164 of the first conductive layers 160. The second conductive layers 180 are located on surfaces of the first glass fiber layer containing non-cured epoxy 147, the second glass fiber layer containing non-cured epoxy 148, the support layer 140, and the substrate 110 that face long through holes 150', and each of the second conductive layers 180 extends vertically to the adjacent first end 162 (not shown in the figure) along the surface 144 of the support layer 140 opposite to the substrate 110 or to the adjacent second end 164 (as shown in FIG. 13) along the second surface 114 of the substrate 110.

Each of the second conductive layers 180 has a third end 182 and a fourth end 184 opposite to the third end 182. The third end 182 extends to a surface of the first glass fiber layer containing non-cured epoxy 147 opposite to the support layer 140. The fourth end 184 extends to a surface of the second glass fiber layer containing non-cured epoxy 148 opposite to the second surface 114 of the substrate 110. The second protective layer 174 covers a surface of the first glass fiber layer containing non-cured epoxy 147 opposite to the substrate 110 and the third end 182 of the second conductive layers 180. The third protective layer 176 covers the surface of the second glass fiber layer containing non-cured epoxy 148 opposite to the substrate 110 and the fourth ends 184 of the second conductive layers 180. In addition, the fourth protective layers 178 are respectively located in the long through holes 150'.

Hence, after each of the second conductive layers 180 is connected to a line formed by one or more of the first conductive layers 160, the third ends 182 and the fourth ends 184 of the second conductive layers 180 located on surfaces of the printed circuit board package structure 100*b* can be used for electrically connecting an electronic device (such as an IC) in the subsequent surface mount technology (SMT) process, such that the line formed by each of the first conductive layers 160 may be reduced. The lines extend on the surfaces of the printed circuit board package structure 100*b* to serve as the space required by electrical connection.

Compared with FIG. 4 and the manufacturing method of the printed circuit board package structure 100*b*, the manufacturing method of the printed circuit board package structure 100*b* further includes the following steps: in step S11, attach a first glass fiber layer containing non-cured epoxy and a first copper foil layer to the surface of support layer opposite to the substrate so that the first glass fiber layer containing non-cured epoxy covers the support layer and the first copper foil layer covers the first glass fiber layer containing non-cured epoxy. In step S12, attach a second glass fiber layer containing non-cured epoxy and a second copper foil layer to the second surface of the substrate so that the second glass fiber layer containing non-cured epoxy covers the second surface of the substrate and the second copper foil layer covers the second glass fiber layer containing non-cured epoxy. In step S13, form one or a plurality of long through holes that penetrate through the copper foil layers, the glass fiber layers containing non-cured epoxy, the support layer, and the substrate, and the long through holes are connected to the patterned first conductive layers in step S7 of FIG. 4. In step S14, form a plurality of second conductive layers on surfaces of the long through holes in step S13 and surfaces of the copper foil layers opposite to the substrate. In step S15, form a plurality of fourth protective layers in the long through holes, respectively. In step S16, pattern the copper foil layers in step S11 and S12 to form the second conductive layers. In step S17, form a second protective layer and a third protective layer to cover the patterned second conductive layers in step S16.

In addition, the manufacturing method of the printed circuit board package structure 100*b* may further include cutting the second protective layer, the glass fiber layers containing non-cured epoxy, the support layer, the substrate, and the third protective layer along a direction perpendicular to the first grooves so that each of the first grooves forms an opening on a side surface of the substrate after being cut.

Figure 14:
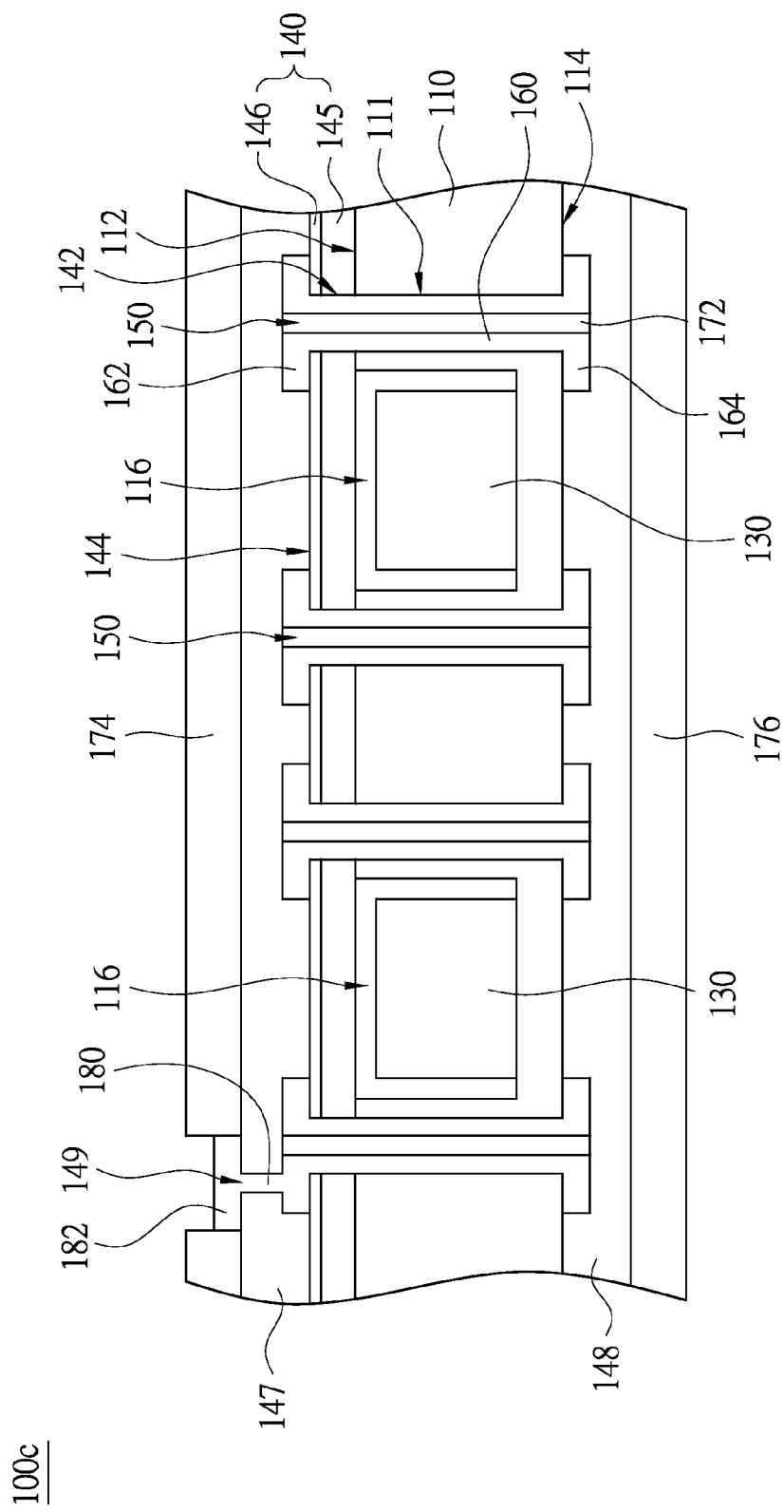
FIG. 14 is a cross-sectional view of a printed circuit board package structure according to still another embodiment of this invention with a profile position same as that in FIG. 2.

FIG. 14 is a cross-sectional view of a printed circuit board package structure 100*c* according to still another embodiment of this invention with a profile position same as that in FIG. 2. The printed circuit board package structure 100*c* includes the first glass fiber layer containing non-cured epoxy 147, the second conductive layers 180, the second glass fiber layer containing non-cured epoxy 148, the second protective layer 174, and the third protective layer 176. The first glass fiber layer containing non-cured epoxy 147 covers the surface 144 of the support layer 140 opposite to the substrate 110 and the first ends 162 of the first conductive layers 160. The first glass fiber layer containing non-cured epoxy 147 has a plurality of through areas 149, and each of the through areas 149 is located on a surface of the first end 162 opposite to the support layer 140. The through areas 149 extend perpendicularly to the surface of the first glass fiber layer containing non-cured epoxy 147 opposite to the support layer 140. The second conductive layers 180 are respectively located on surfaces of the first glass fiber layer containing non-cured epoxy 147 facing the through areas 149. Each of the second conductive layers 180 has a third end 182 and the third end 182 extends to the surface of the first glass fiber layer containing non-cured epoxy 147 opposite to the support layer 140.

In addition, the second glass fiber layer containing non-cured epoxy 148 covers the second surface 114 of the substrate 110 and the second ends 164 of the first conductive layers 160. The second protective layer 174 covers the surface of the first glass fiber layer containing non-cured epoxy 147 opposite to the substrate 110 and side surfaces of the third ends 182 of the second conductive layers 180 so that the third ends 182 of the second conductive layers 180 are exposed through the second protective layer 174. The third protective layer 176 covers the surface of the second glass fiber layer containing non-cured epoxy 148 opposite to the substrate 110.

After the printed circuit board package structure 100c is cut, the cut printed circuit board package structure 100c may only have a single through area 149 and a single second conductive layer 180. The present invention is not limited by the numbers of the through areas 149 and the second conductive layers 180. In this embodiment, the surface of the first glass fiber layer containing non-cured epoxy 147 may have a copper foil layer. The surface of the second glass fiber layer containing non-cured epoxy 148 may have a reinforcing support layer.

Compared with FIG. 4 and the manufacturing method of the printed circuit board package structure 100c, the manufacturing method of the printed circuit board package structure 100c further includes the following steps: in step S21, attach a first glass fiber layer containing non-cured epoxy and a copper foil layer to the surface of support layer opposite to the substrate so that the first glass fiber layer containing non-cured epoxy covers the support layer and the copper foil layer covers the first glass fiber layer containing non-cured epoxy. In step S22, attach a second glass fiber layer containing non-cured epoxy and a reinforcing support layer to the second surface of the substrate so that the second glass fiber layer containing non-cured epoxy covers the second surface of the substrate and the reinforcing support layer covers the second glass fiber layer containing non-cured epoxy. In step S23, form one or a plurality of through areas that penetrate through the copper foil layer and the first glass fiber layer containing non-cured epoxy in step S21, and the through areas are connected to the patterned first conductive layers in step S7 of FIG. 4. In step S24, form a second conductive layer on a surface of each of the through areas in step 23 and a surface of the copper foil layer in step S21 opposite to the substrate. In step S25, pattern the copper foil layer in step 21 to form the second conductive layer. In step S26, form a second protective layer to cover the patterned second conductive layer in step S25.

The reinforcing support layer in step S22 may be a copper foil layer, a release film, epoxy, or a glass fiber layer containing cured epoxy, but the present invention is not limited in this regard. The reinforcing support layer may be removed after step S22 is finished and replaced with a third protective layer.

In addition, the manufacturing method of the printed circuit board package structure 100c may further include cutting the second protective layer, the glass fiber layers containing non-cured epoxy, the support layer, the substrate, and the reinforcing support layer or cutting the second protective layer, the glass fiber layers containing non-cured epoxy, the support layer, the substrate, and the third protective layer along a direction perpendicular to the first grooves so that each of the first grooves forms an opening on a side surface of the substrate after being cut.

Figure 15:
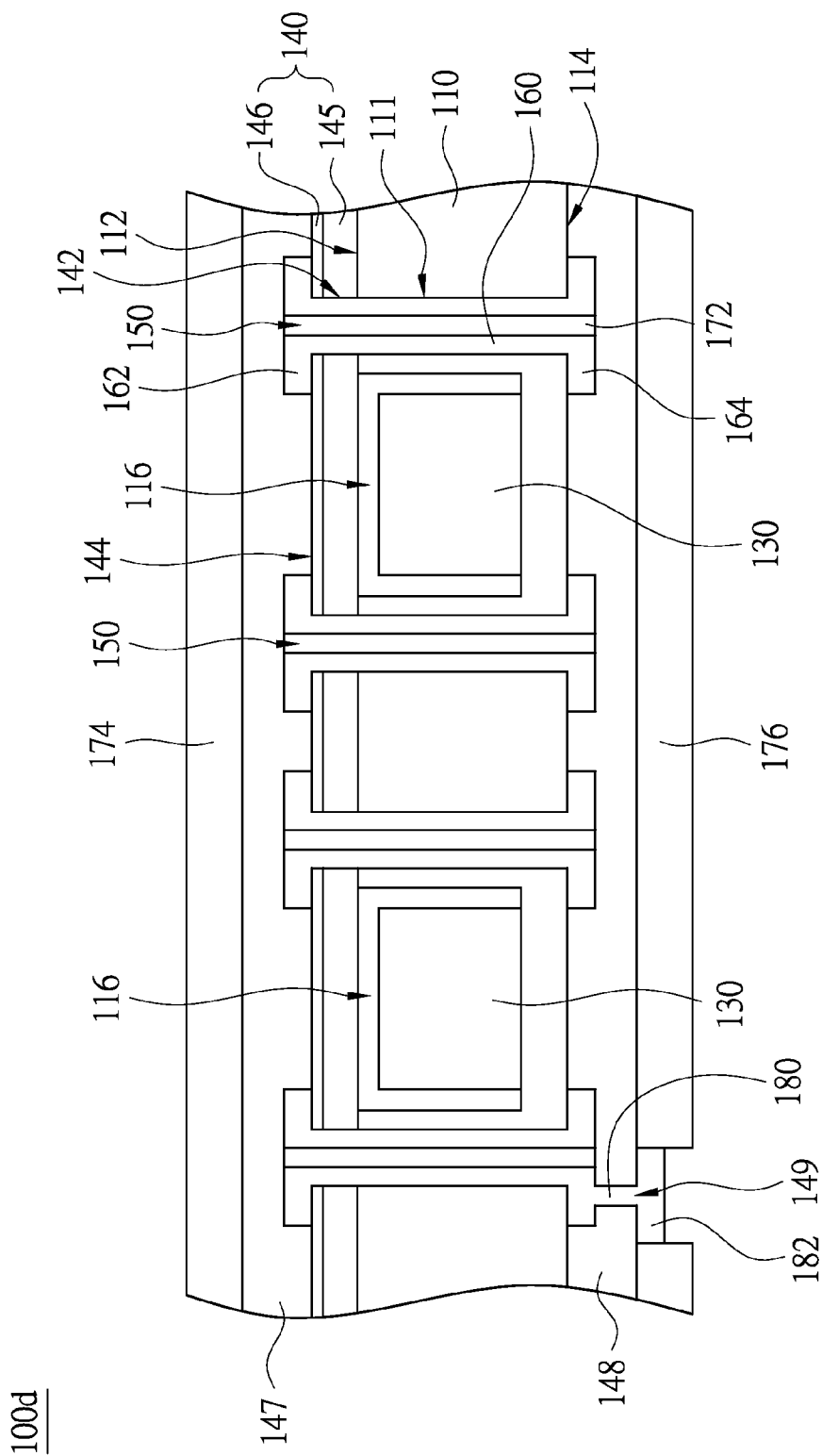
FIG. 15 is a cross-sectional view of a printed circuit board package structure according to yet another embodiment of this invention with a profile position same as that in FIG. 2.

FIG. 15 is a cross-sectional view of a printed circuit board package structure 100d according to yet another embodiment of this invention with a profile position same as that in FIG. 2. The printed circuit board package structure 100d includes the first glass fiber layer containing non-cured epoxy 147, the second glass fiber layer containing non-cured epoxy 148, the second conductive layers 180, the second protective layer 174, and the third protective layer 176. The first glass fiber layer containing non-cured epoxy 147 covers the surface 144 of the support layer 140 opposite to the substrate 110 and the first ends 162 of the first conductive layers 160.

Moreover, the second glass fiber layer containing non-cured epoxy 148 covers the second surface 114 of the substrate 110 and the second ends 164 of the first conductive layers 160. The second glass fiber layer containing non-cured epoxy 148 has the through areas 149, and each of the through areas 149 is located on a surface of the second end 164 opposite to the substrate 110. The through areas 149 extend perpendicularly to the surface of the second glass fiber layer containing non-cured epoxy 148 opposite to the substrate 110. The second conductive layers 180 are respectively located on surfaces of the second glass fiber layer containing non-cured epoxy 148 facing the through areas 149. Each of the second conductive layers 180 has the third end 182 and the third end 182 extends to the surface of the second glass fiber layer containing non-cured epoxy 148 opposite to the substrate 110. The second protective layer 174 covers the surface of the first glass fiber layer containing non-cured epoxy 147 opposite to the substrate 110. The third protective layer 176 covers the surface of the second glass fiber layer containing non-cured epoxy 148 opposite to the substrate 110 and side surfaces of the third ends 182 of the second conductive layers 180 so that the third ends 182 of the second conductive layers 180 are exposed through the third protective layer 176.

After the printed circuit board package structure 100d is cut, the cut printed circuit board package structure 100d may only have a single through area 149 and a single second conductive layer 180. The present invention is not limited by the numbers of the through areas 149 and the second conductive layers 180. In this embodiment, the surface of the first glass fiber layer containing non-cured epoxy 147 may have a reinforcing support layer. The surface of the second glass fiber layer containing non-cured epoxy 148 may have a copper foil layer.

Compared with FIG. 4 and the manufacturing method of the printed circuit board package structure 100c, the manufacturing method of the printed circuit board package structure 100c further includes the following steps: in step S31, attach a first glass fiber layer containing non-cured epoxy and a reinforcing support layer to the surface of support layer opposite to the substrate so that the first glass fiber layer containing non-cured epoxy covers the support layer and the reinforcing support layer covers the first glass fiber layer containing non-cured epoxy. In step S32, attach a second glass fiber layer containing non-cured epoxy and a copper foil layer to the second surface of the substrate so that the second glass fiber layer containing non-cured epoxy covers the second surface of the substrate and the copper foil layer covers the second glass fiber layer containing non-cured epoxy. In step S33, form one or a plurality of through areas that penetrate through the copper foil layer and the second glass fiber layer containing non-cured epoxy in step S32, and the through areas are connected to the patterned first conductive layers in step S7 of FIG. 4. In step S34, form a second conductive layer on a surface of each of the through areas in step 33 and a surface of the copper foil layer in step S32 opposite to the substrate. In step S35, pattern the copper foil layer in step 32 to form the second conductive layers. In step S36, form a second protective layer to cover the patterned second conductive layers in step S35.

The reinforcing support layer in step S31 may be a copper foil layer, a release film, epoxy, or a glass fiber layer containing cured epoxy, but the present invention is not limited in this regard. The reinforcing support layer may be removed after step S31 is finished and replaced with a third protective layer.

In addition, the manufacturing method of the printed circuit board package structure 100d may further include cutting the reinforcing support layer, the glass fiber layers containing non-cured epoxy, the support layer, the substrate, and the second protective layer or cutting the third protective layer, the glass fiber layers containing non-cured epoxy, the support layer, the substrate, and the second protective layer along a direction perpendicular to the first grooves so that each of the first grooves forms an opening on a side surface of the substrate after being cut.

The advantages of the printed circuit board package structure 100c and the manufacturing method thereof shown in FIG. 14 and the printed circuit board package structure 100d and the manufacturing method thereof shown in FIG. 15 are as follows: the protective layers (such as a solder mask) may be applied artificially. Since the glass fiber layers containing non-cured epoxy (PP) is underneath the protective layers when the protective layers are coated, the solder mask can be thin to avoid a reduced reliability caused by the non-uniform solder mask. In addition, the glass fiber layer containing non-cured epoxy renders the overall structure firmer to improve the reliability.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A printed circuit board package structure comprising:
   a substrate having a first surface and a second surface opposite to the first surface, a plurality of first ring-shaped recesses, and a plurality of first grooves, wherein the first ring-shaped recesses and the first grooves are located on the first surface, each of the first ring-shaped recesses is communicated with another one of the first ring-shaped recesses through at least one of the first grooves, and at least two of the first ring-shaped recesses are communicated with a side surface of the substrate through the first grooves to form at least two openings;
   a plurality of ring-shaped magnetic elements respectively located in the first ring-shaped recesses;
   a support layer located on the first surface of the substrate, and covering the first ring-shaped recesses and the first grooves, and comprising a glass fiber layer containing non-cured epoxy and a glass fiber layer containing cured epoxy, wherein the support layer and the substrate have a plurality of through holes, and the through holes are adjacent to the first ring-shaped recesses, and the glass fiber layer containing non-cured epoxy is located at a lower level of the support layer and covers the first ring-shaped recesses and the first grooves, and the glass fiber layer containing cured epoxy is located at an upper level of the support layer and covers the lower-leveled glass fiber layer containing non-cured epoxy; and
   a plurality of first conductive layers respectively located on surfaces of the support layer and the substrate facing the through holes, wherein each of the first conductive layers has a first end and a second end opposite to the first end, and the first end extends to a surface of the support layer opposite to the substrate, the second end extends to the second surface of the substrate.

2. The printed circuit board package structure of claim 1, further comprising:
   a plurality of first protective layers respectively located in the through holes.

3. The printed circuit board package structure of claim 1, further comprising:
   a second protective layer covering the surface of the support layer opposite to the substrate and the first ends of the first conductive layers; and
   a third protective layer or a reinforcing support layer covering the second surface of the substrate and the second ends of the first conductive layers.

4. The printed circuit board package structure of claim 1, further comprising:
   a first glass fiber layer containing non-cured epoxy covering the surface of the support layer opposite to the substrate and the first ends of the first conductive layers;
   a second glass fiber layer containing non-cured epoxy covering the second surface of the substrate and the second ends of the first conductive layers;
   a plurality of second conductive layers respectively located on surfaces of the first glass fiber layer containing non-cured epoxy, the second glass fiber layer containing non-cured epoxy, the support layer, and the substrate that face the through holes, wherein each of the second conductive layers extends perpendicularly to the adjacent first end along the surface of the support layer opposite to the substrate or extends perpendicularly to the adjacent second end along the second surface of the substrate, each of the second conductive layers has a third end and a fourth end opposite to the third end and the third end extends to a surface of the first glass fiber layer containing non-cured epoxy opposite to the support layer, the fourth end extends to a surface of the second glass fiber layer containing non-cured epoxy opposite to the second surface;
   a second protective layer covering a surface of the first glass fiber layer containing non-cured epoxy opposite to the substrate and the third ends of the second conductive layers; and
   a third protective layer or a reinforcing support layer covering the surface of the second glass fiber layer containing non-cured epoxy opposite to the substrate and the fourth ends of the second conductive layers.

5. The printed circuit board package structure of claim 4, further comprising:
   a plurality of fourth protective layers respectively located in the through holes.

6. The printed circuit board package structure of claim 1, further comprising:
   a first glass fiber layer containing non-cured epoxy covering the surface of the support layer opposite to the substrate and the first ends of the first conductive layers, wherein the first glass fiber layer containing non-cured epoxy has a plurality of through areas, and the through areas are located on surfaces of the first ends opposite to the support layer and extend perpendicularly to a surface of the first glass fiber layer containing non-cured epoxy opposite to the support layer;

a plurality of second conductive layers respectively located on surfaces of the first glass fiber layer containing non-cured epoxy facing the through areas, wherein each of the second conductive layers has a third end extending to the surface of the first glass fiber layer containing non-cured epoxy opposite to the support layer;

a second glass fiber layer containing non-cured epoxy covering the second surface of the substrate and the second ends of the first conductive layers;

a second protective layer covering a surface of the first glass fiber layer containing non-cured epoxy opposite to the substrate and side surfaces of the third ends of the second conductive layers so that the third ends of the second conductive layers are exposed through the second protective layer; and a third protective layer or a reinforcing support layer covering a surface of the second glass fiber layer containing non-cured epoxy opposite to the substrate.

7. The printed circuit board package structure of claim 1, further comprising:
a first glass fiber layer containing non-cured epoxy covering the surface of the support layer opposite to the substrate and the first ends of the first conductive layers;
a second glass fiber layer containing non-cured epoxy covering the second surface of the substrate and the second ends of the first conductive layers, wherein the second glass fiber layer containing non-cured epoxy has a plurality of through areas, and the through areas are located on surfaces of the second ends opposite to the substrate and extend perpendicularly to a surface of the second glass fiber layer containing non-cured epoxy opposite to the substrate;
a plurality of second conductive layers respectively located on surfaces of the second glass fiber layer containing non-cured epoxy facing the through areas, wherein each of the second conductive layers has a third end extending to the surface of the second glass fiber layer containing non-cured epoxy opposite to the substrate;
a second protective layer covering a surface of the first glass fiber layer containing non-cured epoxy opposite to the substrate; and
a third protective layer or a reinforcing support layer covering the surface of the second glass fiber layer containing non-cured epoxy opposite to the substrate and side surfaces of the third ends of the second conductive layers so that the third ends of the second conductive layers are exposed through the third protective layer or the reinforcing support layer.

8. The printed circuit board package structure of claim 1, wherein diameters of the first ring-shaped recesses are the same.

9. The printed circuit board package structure of claim 1, wherein lengthwise directions of the first grooves are the same.

10. The printed circuit board package structure of claim 1, wherein a distance between two opposite inner walls of each of the first ring-shaped recesses is the same as a distance between two opposite inner walls of each of the first grooves.

11. The printed circuit board package structure of claim 1, wherein a depth of each of the first ring-shaped recesses is the same as a depth of each of the first grooves.

12. The printed circuit board package structure of claim 1, wherein the substrate further has a plurality of second ring-shaped recesses and a plurality of second grooves, the second ring-shaped recesses and the second grooves are located on the first surface of the substrate, and two ends of each of the second grooves are communicated with the two adjacent second ring-shaped recesses.

13. The printed circuit board package structure of claim 12, wherein each of the second grooves crosses and is communicated with one of the first grooves.

14. The printed circuit board package structure of claim 12, wherein a lengthwise direction of the second grooves is perpendicular to a lengthwise direction of the first grooves.

15. The printed circuit board package structure of claim 12, wherein a distance between two opposite inner walls of each of the second ring-shaped recesses is smaller than a distance between two opposite inner walls of each of the first ring-shaped recesses.

16. The printed circuit board package structure of claim 12, wherein a distance between two opposite inner walls of each of the second ring-shaped recesses is the same as a distance between two opposite inner walls of each of the second grooves.

17. The printed circuit board package structure of claim 12, wherein a depth of each of second ring-shaped recesses is the same as a depth of each of the second grooves.

18. A printed circuit board package structure comprising:
a substrate having a first surface and a second surface opposite to the first surface, a ring-shaped recess, and a plurality of grooves, wherein the ring-shaped recess and the grooves are located on the first surface, and the ring-shaped recess is communicated with a side surface of the substrate through the grooves to form at least two openings;
a ring-shaped magnetic element located in the ring-shaped recess;
a support layer located on the first surface of the substrate, and covering the ring-shaped recess and the grooves, and comprising a glass fiber layer containing non-cured epoxy and a glass fiber layer containing cured epoxy, wherein the support layer and the substrate have a plurality of through holes, and the through holes are adjacent to the ring-shaped recess, and the glass fiber layer containing non-cured epoxy is located at a lower level of the support layer and covers the ring-shaped recess and the grooves, and the glass fiber layer containing cured epoxy is located at an upper level of the support layer and covers the lower-leveled glass fiber layer containing non-cured epoxy; and
a plurality of first conductive layers respectively located on surfaces of the support layer and the substrate facing the through holes, wherein each of the first conductive layers has a first end and a second end opposite to the first end, and the first end extends to a surface of the support layer opposite to the substrate, the second end extends to the second surface of the substrate.

19. The printed circuit board package structure of claim 18, further comprising:
a plurality of first protective layers respectively located in the through holes.

20. The printed circuit board package structure of claim 18, further comprising:
- a second protective layer covering the surface of the support layer opposite to the substrate and the first ends of the first conductive layers; and
- a third protective layer or a reinforcing support layer covering the second surface of the substrate and the second ends of the first conductive layers.

21. The printed circuit board package structure of claim 18, further comprising:
- a first glass fiber layer containing non-cured epoxy covering the surface of the support layer opposite to the substrate and the first ends of the first conductive layers;
- a second glass fiber layer containing non-cured epoxy covering the second surface of the substrate and the second ends of the first conductive layers;
- one or a plurality of second conductive layers respectively located on surfaces of the first glass fiber layer containing non-cured epoxy, the second glass fiber layer containing non-cured epoxy, the support layer, and the substrate facing the through holes, wherein each of the second conductive layers extends perpendicularly to the adjacent first end along the surface of the support layer opposite to the substrate or extends perpendicularly to the adjacent second end along the second surface of the substrate, each of the second conductive layers has a third end and a fourth end opposite to the third end, and the third end extends to a surface of the first glass fiber layer containing non-cured epoxy opposite to the support layer, the fourth end extends to a surface of the second glass fiber layer containing non-cured epoxy opposite to the second surface;
- a second protective layer covering a surface of the first glass fiber layer containing non-cured epoxy opposite to the substrate and the third ends of the second conductive layers; and
- a third protective layer or a reinforcing support layer covering the surface of the second glass fiber layer containing non-cured epoxy opposite to the substrate and the fourth ends of the second conductive layers.

22. The printed circuit board package structure of claim 18, further comprising:
- a first glass fiber layer containing non-cured epoxy covering the surface of the support layer opposite to the substrate and the first ends of the first conductive layers, wherein the first glass fiber layer containing non-cured epoxy has at least one through area, the through area is located on a surface of one of the first ends opposite to the support layer and extends perpendicularly to a surface of the first glass fiber layer containing non-cured epoxy opposite to the support layer;
- at least one second conductive layer located on a surface of the first glass fiber layer containing non-cured epoxy facing the through area, wherein the second conductive layer has a third end extending to the surface of the first glass fiber layer containing non-cured epoxy opposite to the support layer;
- a second glass fiber layer containing non-cured epoxy covering the second surface of the substrate and the second ends of the first conductive layers;
- a second protective layer covering a surface of the first glass fiber layer containing non-cured epoxy opposite to the substrate and a side surface of the third end of the second conductive layer so that the third end of the second conductive layer is exposed through the second protective layer; and
- a third protective layer or a reinforcing support layer covering a surface of the second glass fiber layer containing non-cured epoxy opposite to the substrate.

23. The printed circuit board package structure of claim 18, further comprising:
- a first glass fiber layer containing non-cured epoxy covering the surface of the support layer opposite to the substrate and the first ends of the first conductive layers;
- a second glass fiber layer containing non-cured epoxy covering the second surface of the substrate and the second ends of the first conductive layers, wherein the second glass fiber layer containing non-cured epoxy has at least one through area, the through area is located on a surface of one of the second ends opposite to the substrate and extends perpendicularly to a surface of the second glass fiber layer containing non-cured epoxy opposite to the substrate;
- at least one second conductive layer located on a surface of the second glass fiber layer containing non-cured epoxy facing the through area, wherein the second conductive layers has a third end extending to the surface of the second glass fiber layer containing non-cured epoxy opposite to the substrate;
- a second protective layer covering a surface of the first glass fiber layer containing non-cured epoxy opposite to the substrate; and
- a third protective layer or a reinforcing support layer covering the surface of the second glass fiber layer containing non-cured epoxy opposite to the substrate and a side surface of the third end of the second conductive layer so that the third end of the second conductive layer is exposed through the third protective layer or the reinforcing support layer.

24. The printed circuit board package structure of claim 18, wherein lengthwise directions of the grooves are the same.

25. The printed circuit board package structure of claim 18, wherein a distance between two opposite inner walls of the ring-shaped recess is the same as a distance between two opposite inner walls of each of the grooves.

26. The printed circuit board package structure of claim 18, wherein a depth of the ring-shaped recess is the same as a depth of each of the grooves.

* * * * *